United States Patent
Zhang et al.

(10) Patent No.: US 9,224,821 B2
(45) Date of Patent: Dec. 29, 2015

(54) CUSTOMIZABLE NONLINEAR ELECTRICAL DEVICES

(75) Inventors: Minxian Max Zhang, Mountain View, CA (US); Jianhua Yang, Palo Alto, CA (US); Gilberto Medeiros Ribeiro, Palo Alto, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/385,544

(22) PCT Filed: Apr. 26, 2012

(86) PCT No.: PCT/US2012/035187
§ 371 (c)(1),
(2), (4) Date: Sep. 16, 2014

(87) PCT Pub. No.: WO2013/162574
PCT Pub. Date: Oct. 31, 2013

(65) Prior Publication Data
US 2015/0041751 A1     Feb. 12, 2015

(51) Int. Cl.
*H01L 45/00* (2006.01)
*H01L 29/24* (2006.01)
(Continued)

(52) U.S. Cl.
CPC ............. *H01L 29/24* (2013.01); *B82Y 10/00* (2013.01); *G11C 13/003* (2013.01); *G11C 13/0007* (2013.01); *H01L 21/02425* (2013.01); *H01L 21/02565* (2013.01); *H01L 21/02631* (2013.01); *H01L 27/1021* (2013.01);
(Continued)

(58) Field of Classification Search
CPC ..... H01L 45/04; H01L 45/1233; H01L 45/16; H01L 29/861; G11C 13/003; G11C 2213/72
See application file for complete search history.

(56) References Cited

U.S. PATENT DOCUMENTS

| 7,929,335 | B2 | 4/2011 | Gopalakrishnan |
| 8,093,578 | B2 | 1/2012 | Takagi et al. |

(Continued)

FOREIGN PATENT DOCUMENTS

| EP | 2063467 | 5/2009 |
| JP | 2006203098 A | 8/2006 |
| WO | WO-2012042897 | 4/2012 |

OTHER PUBLICATIONS

Fan, W. et al., Metal-oxide-oxide-metal Granular Tunnel Diodes Fabricated by Anodization, American Institute of Physics, Applied Physics Letters, Dec. 19, 2011, vol. 99, No. 25, pp. 252101-1-252101-3.

(Continued)

*Primary Examiner* — Mark Prenty
(74) *Attorney, Agent, or Firm* — Van Cott, Bagley, Cornwall & McCarthy

(57) ABSTRACT

In one example, a customizable nonlinear electrical device includes a first conductive layer, a second conductive layer, and a thin film metal-oxide layer sandwiched between the first conductive layer and the second conductive layer to form a first rectifying interface between the metal-oxide layer and the first conductive layer and a second rectifying interface between the metal-oxide layer and the second conductive layer. The metal-oxide layer includes an electrically conductive mixture of co-existing metal and metal oxides. A method forming a nonlinear electrical device is also provided.

15 Claims, 12 Drawing Sheets

(51) Int. Cl.

| | |
|---|---|
| *H01L 29/47* | (2006.01) |
| *H01L 29/861* | (2006.01) |
| *H01L 29/872* | (2006.01) |
| *B82Y 10/00* | (2011.01) |
| *H01L 27/102* | (2006.01) |
| *G11C 13/00* | (2006.01) |
| *H01L 27/24* | (2006.01) |
| *H01L 21/02* | (2006.01) |
| *H01L 29/8605* | (2006.01) |
| *H01L 29/92* | (2006.01) |
| *H01L 29/06* | (2006.01) |

(52) U.S. Cl.
CPC ....... *H01L 27/2418* (2013.01); *H01L 27/2463* (2013.01); *H01L 29/247* (2013.01); *H01L 29/47* (2013.01); *H01L 29/861* (2013.01); *H01L 29/8605* (2013.01); *H01L 29/8616* (2013.01); *H01L 29/872* (2013.01); *H01L 29/92* (2013.01); *H01L 45/00* (2013.01); *H01L 45/08* (2013.01); *H01L 45/1233* (2013.01); *H01L 45/146* (2013.01); *H01L 45/1625* (2013.01); *G11C 2213/15* (2013.01); *G11C 2213/72* (2013.01); *G11C 2213/74* (2013.01); *H01L 29/0676* (2013.01)

(56) References Cited

U.S. PATENT DOCUMENTS

| | | |
|---|---|---|
| 2009/0289251 A1 | 11/2009 | Kiyotoshi |
| 2010/0084625 A1 | 4/2010 | Wicker et al. |
| 2010/0193760 A1 | 8/2010 | Takagi et al. |
| 2011/0161605 A1 | 6/2011 | Lee et al. |
| 2011/0233500 A1 | 9/2011 | Nishimura et al. |
| 2015/0041751 A1* | 2/2015 | Zhang .................... H01L 29/47 257/4 |

OTHER PUBLICATIONS

Huang, J. et al., Transition of Stable Rectification to Resistive-Switching in Ti/TiO2/Pt Oxide Diode, American Institute of Physics, Applied Physics Letters, Jun. 28, 2010, vol. 96, pp. 262901-1-262901-3.

PCT International Search Report & Written Opinion, Nov. 29, 2012, PCT Patent Application No. PCT/US2012/035187, 9 pages.

Shima, H. et al., Control of Resistance Switching Voltages in Rectifying Pt/TiOx/Pt Trilayer, American Institute of Physics, Applied Physics Letters, Feb. 1, 2008, vol. 92, pp. 043510-1-043510-3.

Shin, Y.C. et al., (In,Sn)2O3/TiO2/Pt Schottky-Type Diode Switch for the TiO2 Resistive Switching Memory Array, American Institute of Physics, Applied Physics Letters, Apr. 25, 2008, vol. 92, No. 16, pp. 162904-1-162904-3.

* cited by examiner

CUSTOMIZABLE NONLINEAR ELECTRICAL DEVICES

BACKGROUND

Nonlinear electrical devices do not exhibit a linear current/voltage relationship. Examples of nonlinear electrical devices include diodes, transistors, some semiconductor structures, and other devices. Nonlinear electrical devices can be used in a wide variety of applications, including amplifiers, oscillators, signal/power conditioning, computing, memory, and other applications.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Conductor/oxide interfaces can be Ohmic (non-rectifying) or rectifying (i.e. Schottky interfaces). However, a conventional Schottky interface cannot sustain a high current. The new rectifier designs and principles described below are based on conductor/metal-oxide contact, where metal-oxide is a mixture of metal atoms, metal cations, and oxygen anions. For example, a nonlinear metal-oxide device can be obtained by reactive sputtering of tantalum (Ta) metal in a controlled oxygen/argon atmosphere. The Ta—Ta oxide) mixture can also be written as (Ta, TaO, $TaO_2$, $Ta_2O_5$) or (Ta, $Ta^{+2}$, $Ta^{+4}$, $Ta^{+5}$ and $O^{-2}$), where Ta is a tantalum atom, $Ta^{+2}$, $Ta^{+4}$ and $Ta^{+5}$ are Ta cations with 2, 4 or 5 ionic bonds with oxygen and $O^{-2}$ is oxygen anion. With controlled oxygen flow, the metal-oxide layer can be customized over a broad range of electronic conductivity, from conductor, to semiconductor, and to insulator. Accordingly, the conductor/metal-oxide interface provides a broad range of rectifying behavior, which can be useful to engineer the rectifying behavior for customized requirements. These conductor/metal-oxide interfaces can be use to produce devices that remain rectifying at very high current and can have symmetric or non-symmetric voltage current characteristics. Tantalum is only used as an example of a transition metal that can be used to form a metal-oxide layer. A variety of other transition metals could be used, such as tungsten, molybdenum, vanadium, and niobium.

Another advantage of a conductor/metal-oxide interface is that it can be integrated into thin film nano devices, such as memristors, memcapacitors, and meminductors to improve their performance. In one example, a memristive switching oxide (TaOx) is coupled to a (Ta, Ta oxide) non-linear rectifier. This combined device exhibits much improved nonlinear switching behavior. It is also shown that connecting a memristor with a nonlinear element in series has advantages over connecting a memristor in series with a fixed value resistor. The nonlinear element will dominate (nonlinear I-V) when device is in the non-switching mode. When the nonlinear element becomes conductive, the voltage across the nonlinear element drops so voltage can be applied to the memristor to switch the state of the memristive oxide.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1:
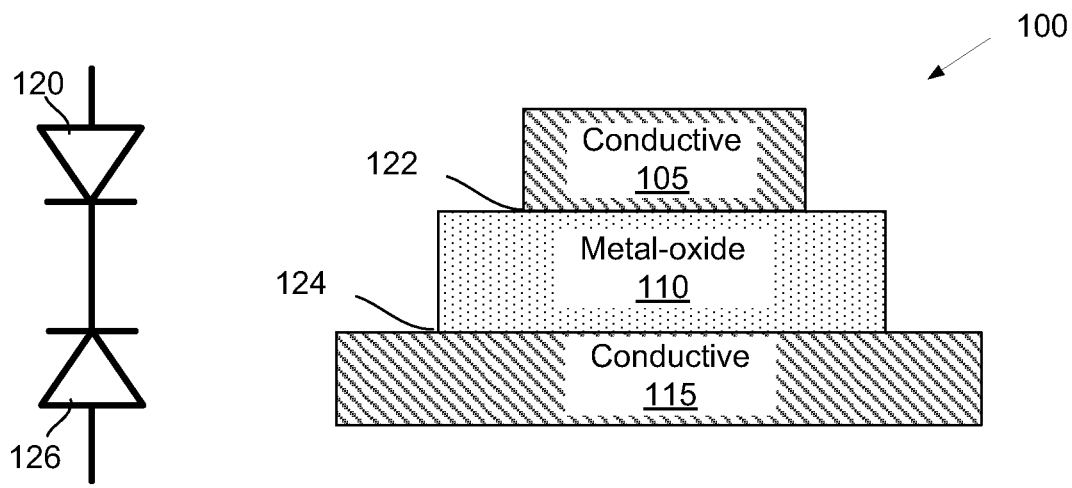
FIG. 1A is a cross sectional diagram and electrical schematic of a customizable nonlinear electrical device, according to one example of principles described herein.

FIG. 1A is a cross sectional diagram of a customizable nonlinear electrical device (100) that includes a conductive top layer (105), a metal-oxide middle layer (110) and a conductive bottom layer (115). The conductive top layer (105) and conductive bottom layer (115) could be formed from a variety of metallic or nonmetallic conductors. For example, the conductive layers may be formed from metals, metal alloys, conductive oxides, conductive carbide, conductive nitride and other appropriate conductive materials. The metal-oxide layer (110) could be formed from a variety of metal and metal oxides. The metal-oxide layer may include a range of compositions of co-existing metal and metal oxide, varying from almost pure metal to fully oxidized metal with excess oxygen anions. In some examples, the metal-oxide layer may include a first metal and an oxide of a second metal.

As a specific example, the conductive top layer (105) and conductive bottom layer (115) may be formed from platinum and the metal-oxide layer may include includes tantalum and tantalum oxides.

The conductive layers (105, 115) and metal-oxide layer (110) have different electrical characteristics. These electrical differences determine the type of electrical interface that forms between the layers. There are two general types of interfaces: Ohmic and rectifying. Ohmic interfaces are non-rectifying and characterized by linear voltage-current relationship that is generally described in Ohm's law. For example, a metal layer in contact with a highly doped semiconductor layer will form an Ohmic interface.

Rectifying interfaces are characterized by electrically non-linear or blocking behavior. The rectifying behavior at an interface depends on the differences between the work function of the metal and the electron affinity of the adjoining material. By enhancing or weakening these differences, the rectifying behavior can be customized and controlled. As discussed above, a metal-oxide layer can interface with a metal layer. The metal-oxide layer may be made up of a mixture of metal atoms, metal cations, and oxygen anions. For example, the metal-oxide layer may include tantalum metal and multiple forms of tantalum oxide, including TaO, $TaO_2$ and $Ta_2O_5$. The co-existing metal atoms and metal oxides in the metal-oxide layer may be completely crystalline, completely amorphous, or partly crystalline and partly amorphous. A metal-oxide layer that is amorphous is metastable and the rate of transformation from the amorphous state to a more stable crystalline state is slow at temperatures close to ambient conditions. Thus, the metal and metal oxide that make up the metal-oxide layer are described as "co-existing" rather than "in equilibrium" to reflect the metastable state of the layer. If at least one the metal atoms or the metal oxides are crystalline, then the metal-oxide layer may be described as having a matrix (continuous) phase and an interspersed (discontinuous) phase. For example, the metal oxide may be a matrix and the metal may be interspersed within the matrix.

By varying the metals used in the device and the composition of the metal-oxide layer, the interface behavior can be customized through a range that varies between highly Ohmic and strongly rectifying. These interfaces can sustain high currents and be customized over a broad rectifying range. When a nonlinear device has two rectifying interfaces, the interfaces may not necessarily be the same. Where the two interfaces are the same, the nonlinear device may exhibit symmetric nonlinear behavior. Where the two interfaces are not the same, the nonlinear device may exhibit non-symmetric nonlinear behavior. These nonlinear devices can be integrated in a wide variety of applications, including thin film implementations that can be incorporated into nanodevices. Thus, a metal-oxide layer is not a switching layer, but a layer that can be used to customize the interfaces and rectifying behavior of the device as a result of the deposited composition of metals and oxides. The composition of the metal-oxide layer remains substantially stable after manufacturing.

At moderate voltages, one rectifying interface will allow electrical current to flow in only one direction and will block the current in opposite direction. As the voltage across the rectifying interface increases, the interface characteristics change from a diode-like blocking behavior to more conductive behavior. This breakdown in the rectifying behavior is reversible and does not damage the interface. The breakdown may be described as occurring at a characteristic voltage (the "breakdown voltage") or gradually over a range of voltages (the "breakdown range"). This rectifying behavior can be electrically represented as a diode. An electrical schematic of the customizable nonlinear electrical device (100) is shown to the right of the device. In this example, the composition of the metal-oxide layer (110) is substantially uniform through the layer and includes a substantial amount of oxide. Thus, the interfaces (122, 124) between the metal-oxide layer (110) and the metallic conductor layers (105, 115) are rectifying. For example, the metallic conductor layers (105, 115) may be platinum or a platinum alloy. The rectifying interfaces (122, 124) are shown as head-to-head diodes (120, 126) in the schematic.

Figure 2:
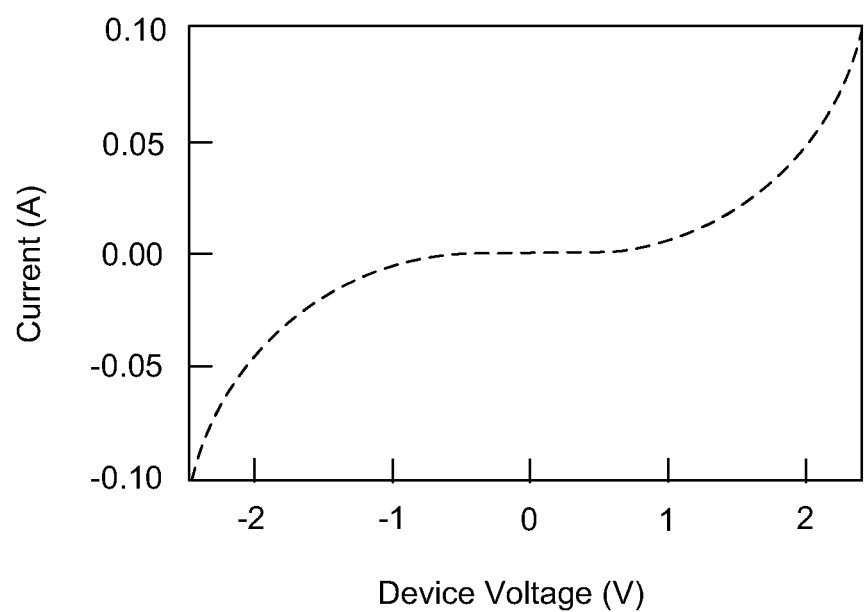
FIG. 2 is a graph of nonlinear electrical behavior of a customizable nonlinear electrical device, according to one example of principles described herein.
Figure 3A:
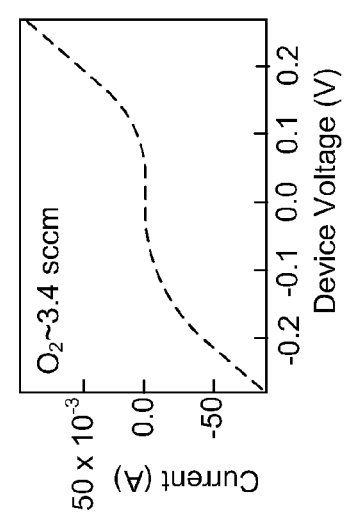
FIGS. 3A-3L are graphs of a number of nonlinear electrical devices that have been customized to exhibit different voltage/current relationships, according to one example of principles described herein.
Figure 3B:
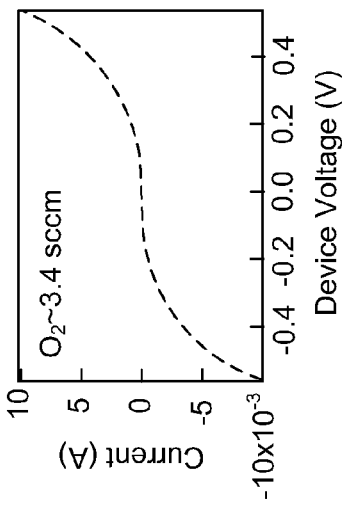
Figure 3C:
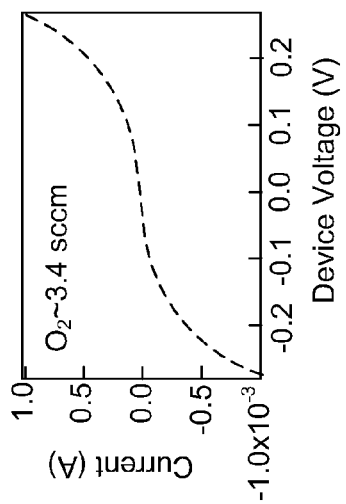
Figure 3D:
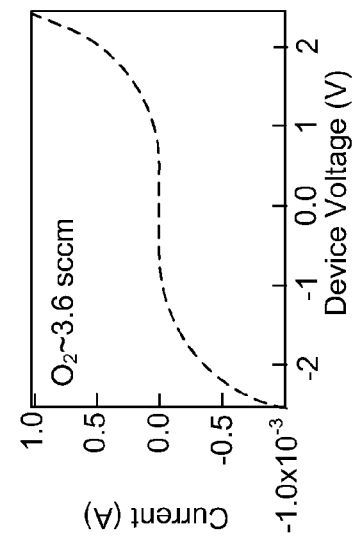
Figure 3E:
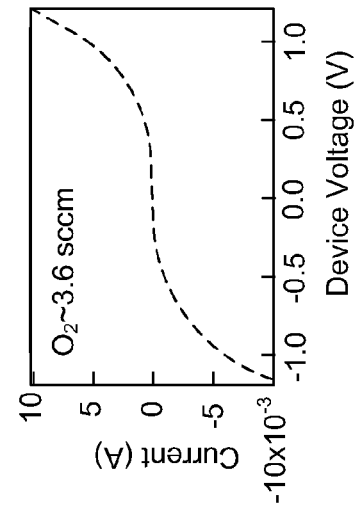
Figure 3F:
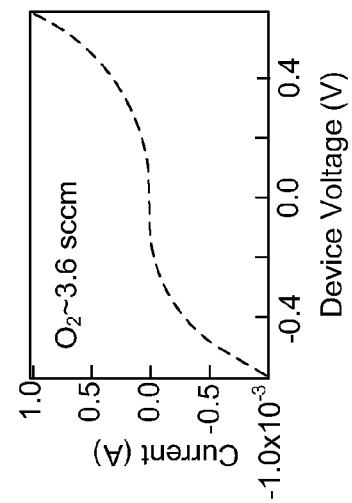
Figure 3I:
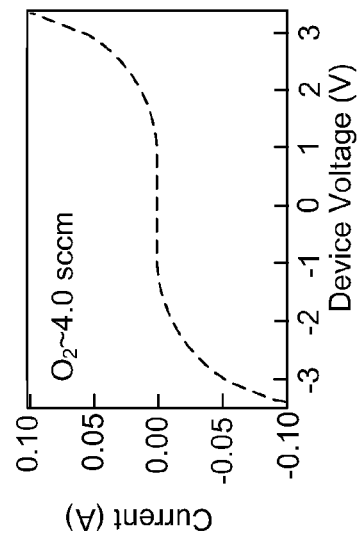
Figure 3L:
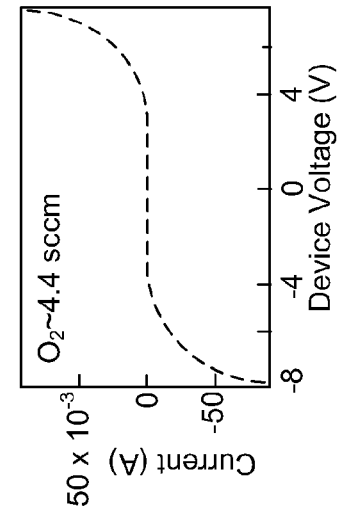
Figure 3H:
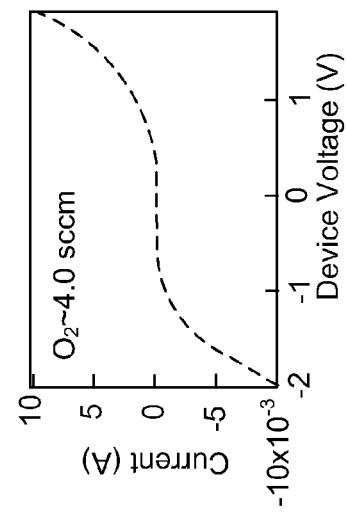
Figure 3K:
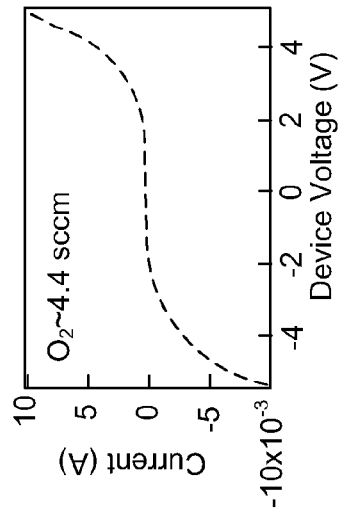
Figure 3G:
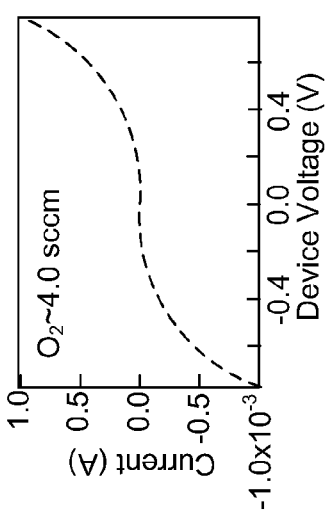
Figure 3J:
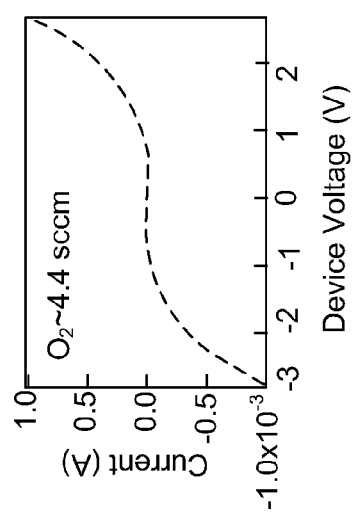

FIG. 2 is a graph that shows the electrical behavior of the device (100) over a range of voltages. The horizontal axis of the graph shows voltages applied across the device and the vertical graph shows electrical currents in amps that pass through the device. For moderate voltages (between approximately −1 volt and +1 volt) the device (100) does not conduct substantial amounts of current. As the applied voltage increases or decreases beyond this region, one of the interfaces begins to break down and current begins to flow through the device. For example, at −2.5 volts a current of −0.1 amps flows through the device. This highly nonlinear behavior can be used in a number of applications, including those described below.

A number of deposition systems could use a variety of techniques to deposit thin films under a controlled oxidation atmosphere. For example, the deposition system may be a sputtering system that includes a sputtering target and a substrate. The target and substrate are mounted in a partially evacuated chamber. Sputtering gas is introduced into the chamber. The sputtering gas is inert and typically argon. Argon can be ionized and the ions accelerated toward the sputtering target by an electrical field to bombard the target and eject material. A portion of this ejected material is then deposited on the substrate as a deposited film. A number of factors may influence the characteristics of the deposited film. For example, if a controlled flow of oxygen is introduced into the chamber, at least a portion of the metal from sputter target will form oxide as a deposited film on the substrate. The composition of the sputtering gas may be altered to achieve the desired oxidation states of the metal or the ratio of oxidized metal to unoxidized metal in the deposited film. To produce a film with a large amount of metal oxide, more oxygen can be introduced into the chamber along with the argon. The oxygen reacts with the metal ejected from the target and produces a metal oxide layer on the substrate. To produce a more metallic film on the substrate, less oxygen is included in the sputtering gas. The inclusion of a reactive gas (oxygen) while sputtering is called "reactive sputtering."

In general, reactive sputtering can be divided into three regimes: low $O_2$ flow, intermediate $O_2$ flow and high $O_2$ flow. Oxygen is only one example of a reactive gas species and the terms "low," "intermediate" and "high" are relative. At low $O_2$ flow, the deposited material is metallic and includes metal that is doped with oxygen. The resulting film is conductive without rectifying effects at interfaces with conductive layers.

At high $O_2$ regimes, the deposited material is an oxide. The resulting oxide film produces rectifying behavior when interfacing with conductive layers. At low currents the interface is rectifying and volatile. At higher currents, the interface will switch to an "on state" that is conductive but is non-volatile.

When performing reactive sputtering with an intermediate $O_2$ flow, the deposited material results in a mixed composition of co-existing metal and metal oxide. The co-existing metal and metal oxide is an electrical conductor, as opposed to a material that has to be doped to be electrically conductive. This co-existing metal and metal oxide forms customizable rectifying behavior at interfaces with conductive layers. When the breakdown voltage of the interface is exceeded, the resistance of the interface dramatically decreases and electrical current can flow across the interface and through the conductive co-existing metal and metal oxide material. This provides controlled volatile nonlinear current/voltage behavior that can match programming/reading voltages and current behavior of a memory device.

Other deposition techniques could also be used form the co-existing metal and metal oxide material. For example, another way to form the co-existing metal and metal oxide material is co-deposition. In co-deposition, material from a metal target and material from an oxide target are sputtered simultaneously and deposited together. Using co-deposition, the metal and the oxide can be different metallic elements. This can be used to produce a metal-oxide layer such as (N, $MO_x$) where N is first metal, and $MO_x$ is an oxide of second metal M.

The device shown in FIG. 1A could be formed using a variety of techniques including reactive sputtering or co-deposition. To form the device (100) using reactive sputtering, a substrate is first coated with a conductive material such as platinum using any of a variety of techniques. The coated substrate is then placed in the sputtering chamber. The desired metal-oxide layer can then be deposited by placing an appropriate metal target in the chamber and introducing the sputtering gas into the chamber. To produce the example shown in FIG. 1A, the target is tantalum and the sputtering gas includes argon and oxygen.

FIGS. 3A-3L show the performance of platinum/tantalum-oxide/platinum devices described above in FIG. 1. The metal-oxide layer was deposited as described above. The oxygen concentration in the sputtering gas was varied to produce different devices with different electrical behavior. The performance of the different devices was tested over varying voltage ranges. Changes in the nonlinear behavior between the graphs illustrate the ability to customize the performance of the electrical devices by altering the amount of oxygen in the sputtering gas. The upper row of graphs (FIGS. 3A-3C) shows the device performance when the 3.4 sccm (standard cubic centimeters per minute) of oxygen were included in the sputtering gas. The oxygen flow rates are given for the specific equipment used. Other deposition systems can be similarly adjusted to achieve layers with the same metal-oxide compositions. The relatively low amount of oxygen listed in FIGS. 3A-3C results in a metal-oxide layer with a lower amount of oxide and a greater amount of metal. Consequently, the device has a relatively high electrical conductivity. In the upper left graph, a voltage of approximately −0.3 Volts produces a currently of $-1 \times 10^{-3}$ amps. The center graph shows that a voltage of approximately −0.6 volts results in a current of $-10 \times 10^{-3}$ amps. As shown in the right graph on the right, increasing the voltage across the device to −1.5 volts produces a current of approximately $-100 \times 10^{-3}$ amps. The shape of the curves in the upper row have a flat portion centered around 0.0 volts and extending a short distance to either side, then increasing conductivity as the absolute value of the voltage increases.

The second row of graphs (FIG. 3D-3F) shows test results for devices that include a metal/oxide layer that was manufactured with an oxygen flow rate of 3.6 sccm. The resulting metal-oxide layers contain more metal oxides and less unoxidized metal; consequently, the metal-oxide layer has a lower conductivity. In this example, the nonlinear voltage current curves have a large flat region that extends between approximately −0.2 volts to +0.2 volts. As discussed above, this indicates that greater absolute voltage values are required to begin breaking down the rectifying interfaces. As shown in the graphs from left to right, application of −0.5 volts results in a current of $1 \times 10^{-3}$ amps passing through the device, application of −1.2 volts results in $-10 \times 10^{-3}$ amps, and application of −2.4 volts resulted in a current of $-100 \times 10^{-3}$ amps.

The next row of graphs (FIGS. 3G-3I) shows the behavior of devices that include a metal-oxide layer that was manufactured with an oxygen flow rate of 4.0 sccm. These devices have lower electrical conductivity and a larger flat or blocking portion centered at 0.0 volts. As shown in the graphs from left to right, application of −0.8 volts results in a current of $1 \times 10^{-3}$ amps passing through the device, application of −2 volts results in $-10 \times 10^{-3}$ amps, and application of −3.4 volts resulted in a current of $-100 \times 10^{-3}$ amps.

The final row of graphs (FIGS. 3J-3L) shows the behavior of devices that include a metal-oxide layer that was manufactured with an oxygen flow rate of 4.4 sccm. These devices have the lowest electrical conductivity and a largest flat or blocking portion centered at 0.0 volts. The large flat linear portion results from the higher breakdown voltage of the rectifying interfaces. As shown in the graphs from left to right, application of approximately −3.2 volts results in a current of $1 \times 10^{-3}$ amps passing through the device, application of −6 volts results in $-10 \times 10^{-3}$ amps, and application of −8 volts resulted in a current of $-100 \times 10^{-3}$ amps. These tests illustrate the ability of a variety of customized nonlinear devices to sustain currents that are at least as high as 100 milliamps. The device voltage data for FIGS. 3A-3L is summarized in Table 1 below.

TABLE 1

| | Device Voltages | | |
|---|---|---|---|
| Oxygen | Applied Current (A) | | |
| Flow Rate | $1 \times 10^{-3}$ | $10 \times 10^{-3}$ | $100 \times 10^{-3}$ |
| 3.4 | −0.3 V | −0.6 V | −1.5 V |
| 3.6 | −0.5 V | −1.2 V | −2.4 V |
| 4 | −0.8 V | −2 V | −3.4 V |
| 4.4 | −3.2 V | −6 V | −8 V |

Figure 4A:
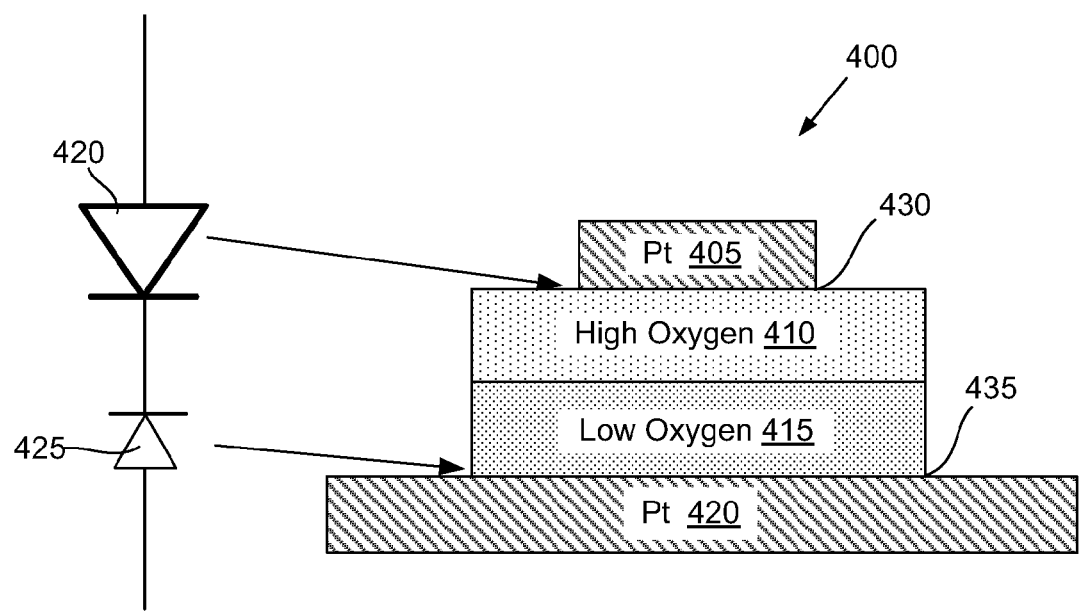
FIG. 4A is a cross sectional diagram of a customizable asymmetric nonlinear electrical device, according to one example of principles described herein.

Thus, by modifying the oxygen content in the sputtering gas, the composition of the metal-oxide layer can be tuned such that the desired rectifying behavior can be obtained. The graphs shown in FIGS. 3A-3L are substantially symmetrical. This results because the two metal/oxide interfaces are substantially similar. FIG. 4A shows a cross section of a device (400) that exhibits asymmetric nonlinear behavior and a corresponding electrical schematic. This asymmetric device (400) includes a top platinum conductor (405) and a bottom platinum conductor (420). Sandwiched in between the two platinum conductors are two metal-oxide layers (410, 415). A high oxygen metal-oxide layer (410) was deposited with a high level of oxygen in the sputtering gas and consequently has a large amount of oxide and a relatively low electrical conductivity. The electrical nature of the platinum layer (405) and high oxygen layer (410) is very different and forms a relatively strong rectifying interface (430). This stronger rectifying interface (430) is represented by the large diode symbol (420) in the electrical schematic.

The lower oxygen metal-oxide layer (415) was created with a lower oxygen content in the sputtering gas and consequently contains a greater amount of unoxidized metal and has a higher electrical conductivity. For example, the low oxygen metal-oxide layer may be formed using a lower oxygen flow rate that the high oxygen metal-oxide layer (410). This lower oxygen metal-oxide layer has electrical characteristics that are more similar to the platinum layer (420) and creates a relatively weaker rectifying interface (435) that is represented by the smaller diode symbol (425). This asymmetric device allows electrical current to flow from the top platinum electrode (405) to the lower platinum electrode (420) more easily than a current can flow from the bottom platinum electrode (420) to the upper platinum electrode (405).

Figure 4B:
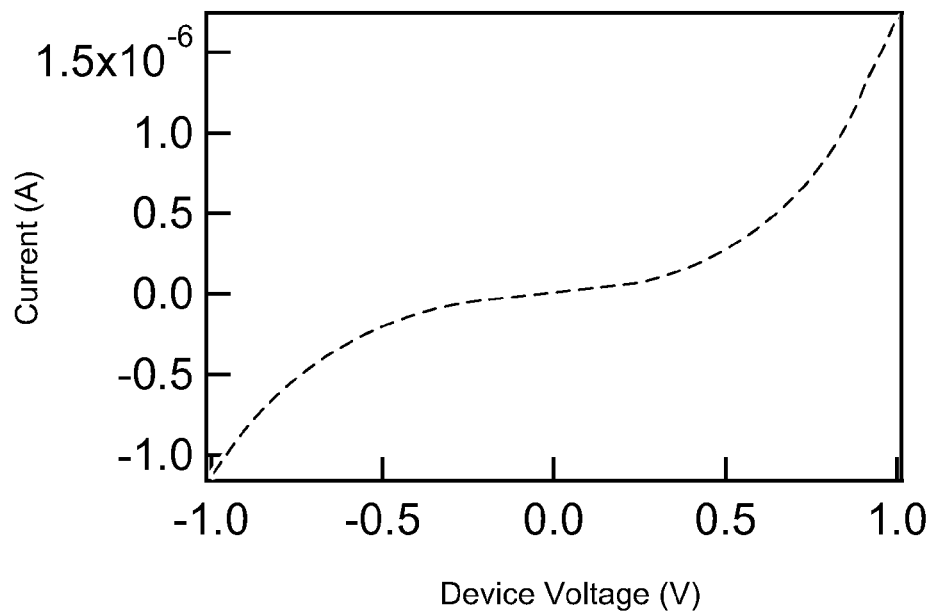
FIG. 4B is a graph of nonlinear electrical behavior of a customizable nonlinear electrical device, according to one example of principles described herein.

This asymmetry is illustrated in FIG. 4B. When a positive electrical voltage is applied, the current flows from the upper platinum electrode (405) to the lower platinum electrode (420). The rectifying behavior of the lower interface (430) breaks down at a lower voltage than the strongly rectifying interface (435). Thus, more current flows through the device (400) when a positive voltage is applied than when a negative voltage with same absolute magnitude is applied. For example, at +1.0 volts, more than $1.5 \times 10^{-6}$ amps of current flow through the device. When −1.0 volts are placed across the device only $1.1 \times 10^{-6}$ amps flow through the device. This asymmetry can be tuned and useful in a number of applications, including the crossbar memory array described below.

Nonlinear devices formed using the principles above could be combined with a number of electrical elements, including memory devices such as memristors, memcapacitors, and meminductors. The type of memory device can be selected according to the needs of the circuit. The examples below describe a memristive device that is incorporated with a nonlinear device to form a combined device. FIGS. 5A-5J show a memristive device (500), a nonlinear device (520), and a combined device (528) that includes both the nonlinear device and the memristive device. The graphs below the cross sectional diagrams of the devices show the electrical behavior of the respective devices.

Figure 5A:
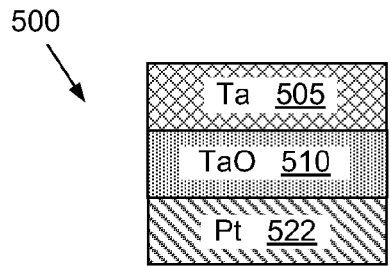
FIGS. 5A-5C show a memristive element and graphs that describe the electrical behavior of the memristive device, according to one example of principles described herein.

FIG. 5A shows a memristive device (500) that includes a tantalum layer (505), tantalum oxide layer (510) and a platinum layer (522). The tantalum oxide layer (510) acts as a memristive matrix. Mobile dopants are moved through the memristive matrix when a voltage above a programming threshold is applied. Motion of the mobile dopants changes the conductivity of the tantalum oxide layer (510). Programming voltages that are higher than the threshold can be used to alter the conductivity of the matrix and voltages that are below the programming threshold can be used to sense the conductivity of the matrix without altering its state. For example, in the simplest case, a memristive matrix may have two states: a conductive state and a nonconductive state. The conductive state may represent a binary "1" and the nonconductive state may represent a binary "0", or visa versa. Binary data can be written into the matrix by changing its conductive state using a programming voltage. The binary data can then be retrieved by applying a reading voltage and sensing the amount of current that flows through the memristive device. The reading voltage is below the programming threshold. A high current indicates a conductive state and a low current represents a resistive state.

Figure 5B:
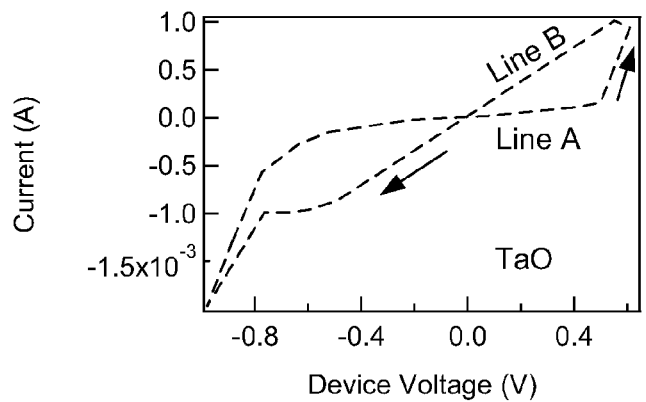

The voltage/current graph in FIG. 5B represents this behavior. Between about −0.4 volts and +0.4 volts, the behavior of the memristive device is linear. The line A is nearly horizontal between −0.4 volts and +0.4 volts and represents the high resistance state of the memristive device. Line B has a greater slope and represents the low resistance state of the device. Beginning on the horizontal line A, an increasingly positive voltage is applied across the memristive device. The behavior of the memristive device remains in a high resistance state (line A) until approximately +0.5 volts and abruptly changes to the low resistance state (line B). This represents the device switching its state from OFF (high resistance) to ON (low resistance). As the voltage levels are moved back toward zero volts and become negative, the device remains conductive behavior (line B) until approximately −0.5V when the device switches its state from ON to OFF (line A). In both the OFF and ON states, the memristive device maintains its substantially linear behavior between −0.4 and +0.4V. Consequently, to read the state of the memristive device, a voltage between −0.4 and +0.4 can be applied. If the current is high, it can be determined that the device is in its high conductance state. If the current is low, it can be determined that the device is in its low conductance state. The application of voltages between −0.4 and +0.4 volts does not change the state of the device. When the positive voltage continues to increase beyond +0.4 volts the state of the memristive device changes back to its low conductive state represented by line A.

Figure 5C:
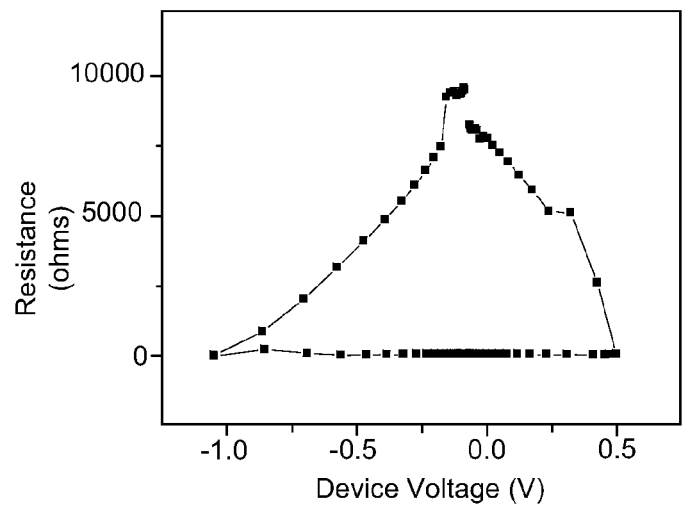

FIG. 5C shows the electrical resistance of the memory device as a function of state and applied voltage. In its low resistance state, the electrical resistance of the device remains close to zero, as shown by the horizontal portion of the curve. When the memristor switches to a high resistance state, the resistances rise to a maximum of approximately 10,000 Ohms.

The structure and composition of a memristive device given above is only one example. A variety of other structures and materials could be used. For example, titanium oxide could be used as the memristive matrix. Additional layers could also be included in the memristive device.

Figure 5D:
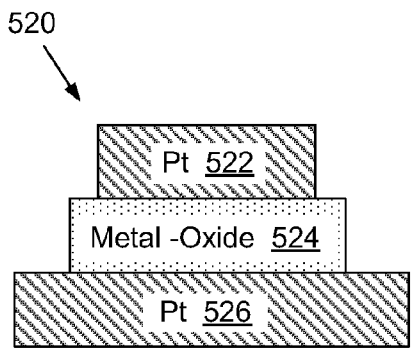
FIG. 5D-5F show a cross-sectional diagram of a customizable nonlinear electrical device and graphs that describe the electrical characteristics of the nonlinear electrical device, according to one example of principles described herein.

FIG. 5D shows nonlinear device (520) that includes an upper platinum layer (522), a metal-oxide layer (524), and a lower platinum layer (526). In one example, the metal-oxide layer is a sputtered film made up of co-existing transition metal oxide and unoxidized transition metal. As discussed above, the metal in the metal-oxide sputtered film may be crystalline or amorphous. Similarly, the metal oxide in the metal-oxide layer may be crystalline or amorphous. For example, the sputtered film can be completely crystalline, completely amorphous, or one phase may be crystalline while the other phase is amorphous.

Figure 5E:
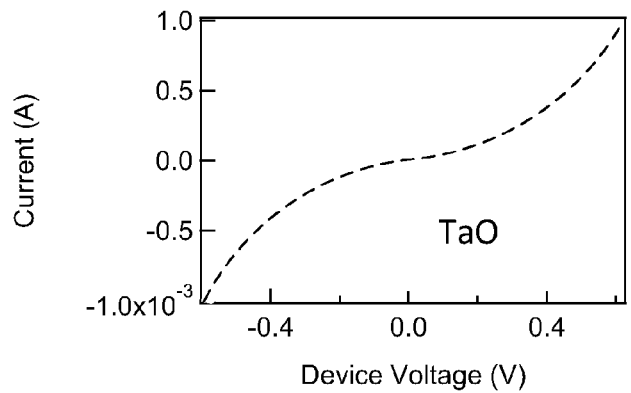

As described above, this nonlinear element has electrical conductivity that increases nonlinearly as a function of increasing voltage magnitudes. The behavior of the nonlinear device (520) has been customized so that its electrical characteristics match the characteristics of the memristive device (500). As shown in FIG. 5E, a current of $\pm 1.0 \times 10^{-3}$ amps at ±0.6 volts closely matches the current passing through the memristive device (500) in its high conductance state when ±0.6 volts are applied. This customization of the properties of the nonlinear device is accomplished by selecting and controlling the desired oxygen flow rate during formation of the metal-oxide layer using reactive sputtering. The metal-oxide layer and its interfaces with adjoining metal contacts produce the desired electric current-voltage characteristics that match the needs of the memristive device (500). In general, a memristive device can have a specific threshold voltage and/or threshold current to switch states. The nonlinear rectifying device can be optimized or matched to the threshold voltage and/or threshold current to improve the nonlinearity and ON/OFF ratio of the combined device.

Figure 5F:
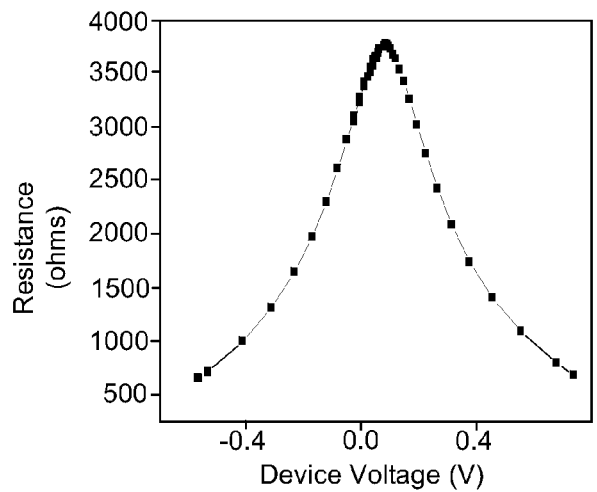

FIG. 5F shows the electrical resistance of the nonlinear device (520) as a function applied voltage. In this example, the electrical resistance of the nonlinear device is symmetrical with a maximum of 3000 ohms centered around 0 volts and minimum resistance of 500 ohms at approximately ±0.5 volts. Comparison of the graphs in FIG. 5C and FIG. 5F show that the resistance of the memory device is not obscured by the resistance of the nonlinear device. For example, for a theoretical reading voltage that applies −0.5 volts across the memory device and −0.5 volts across the nonlinear device, the resistance of the nonlinear device is approximately 500 ohms, and the resistance of the memory device in its low resistance state is approximately zero ohms and the resistance of the memory device in its high resistance state is approximately 4000 ohms.

Figure 5G:
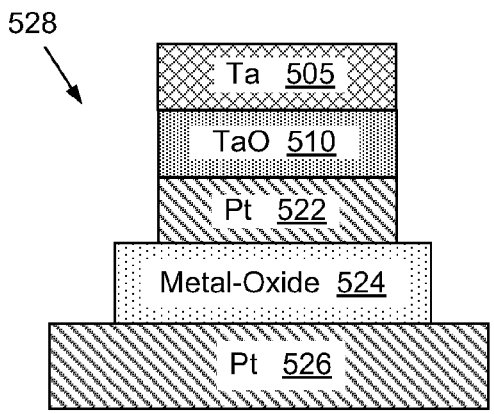
FIG. 5G-5I show a cross-sectional diagram of a combined device and graphs that describe the electrical characteristics of the combined device, according to one example of principles described herein.

FIG. 5G shows a combined device (528) that is a combination of the memristive device (500) and the nonlinear device (520). In this example, the combined device includes an upper tantalum layer (505), a memristive matrix (510) formed from tantalum oxide, a middle platinum layer (522), a tantalum-tantalum oxide layer (524), and a lower platinum layer. The memristive matrix (510) includes tantalum oxide with oxygen deficiencies that act as dopants. In contrast, the tantalum-tantalum oxide layer (524) does not include significant dopants, but may include some percentage of excess metal that has not been oxidized.

Figure 5H:
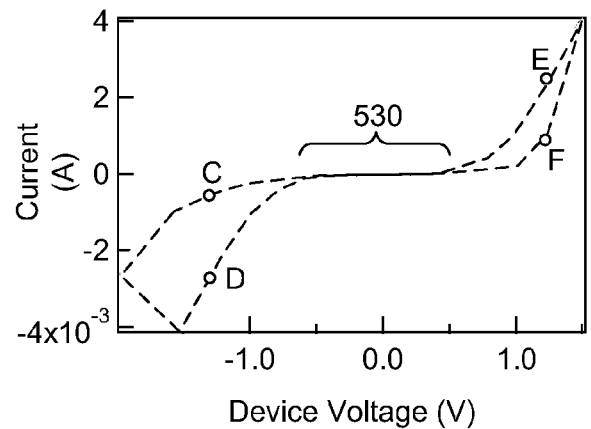
Figure 5I:
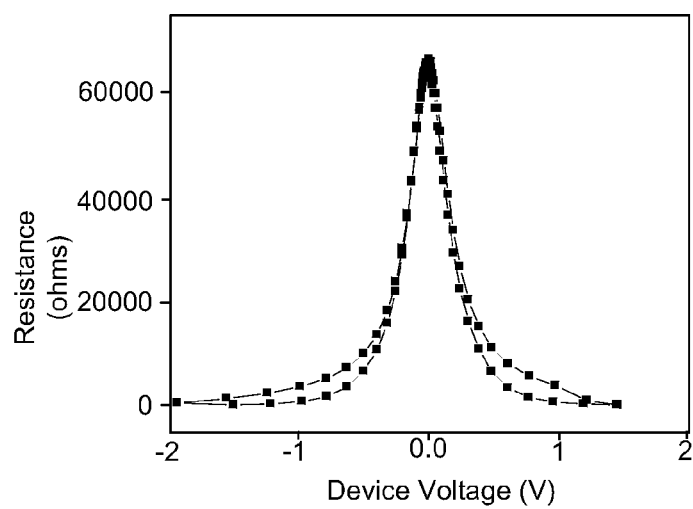

The electrical behavior of the combined device is shown in FIG. 5H, which shows the current/voltage behavior of the device, and FIG. 5I which the resistance of the combined device as a function of applied voltage. In FIG. 5H, a dashed line represents the current voltage behavior of the device. The center portion (530) of dashed line is substantially flat from −0.6 volts to +0.6 volts. This blocking region (530) shows that regardless of the state of the memristive matrix within the combined device, little or no current is conducted through the device (528) between −0.6 volts to +0.6 volts. As the voltage become more negative or positive, current begins to flow through the device. The higher magnitude voltages breakdown the rectifying interfaces between the metal-oxide layer (524) and the platinum layers (522, 526). The memristive layer (510) then becomes a dominating resistance in the device and the state of the memristive layer has a significant influence over the amount of current that flows through the device. For example, when −1.2 volts is applied to the combined device (528) with the memristive matrix (510) in its low conductance state, the current flowing through the device is less than $1 \times 10^{-3}$ amps. This is indicated by the point C on the dotted line. When −1.2 volts is applied to the combined device (528) in its high conductance state, the current flowing through the device is greater than $2 \times 10^{-3}$ amps. This is indicated by the point D on the dotted line. Thus, −1.2 volts may be an appropriate read voltage for the combined device. Similarly, when 1.2 volts are applied across the device (528), a current of less then $1 \times 10^{-3}$ amps flows through the device when it is in its low conductance state and a current of greater than $2 \times 10^{-3}$ volts flows through the device when it is in its high conductance state.

Combining a memristive device and a customizable nonlinear device together can have a number of advantages, including increasing the ON-state resistance. In some implementations, the ON-state resistance is increased by a factor of three or more compared to a memristive device by itself. Thus, when the memristor is in its conductive state (ON) the overall resistance of the combined device (528) is significantly increased. This increased resistance results in a large blocking region (530) shown in FIG. 5H. This can result in lower currents passing through the device for a given read voltage, reducing leak path currents, reducing power consumption, and decreasing internal heating of the device.

Figure 5J:
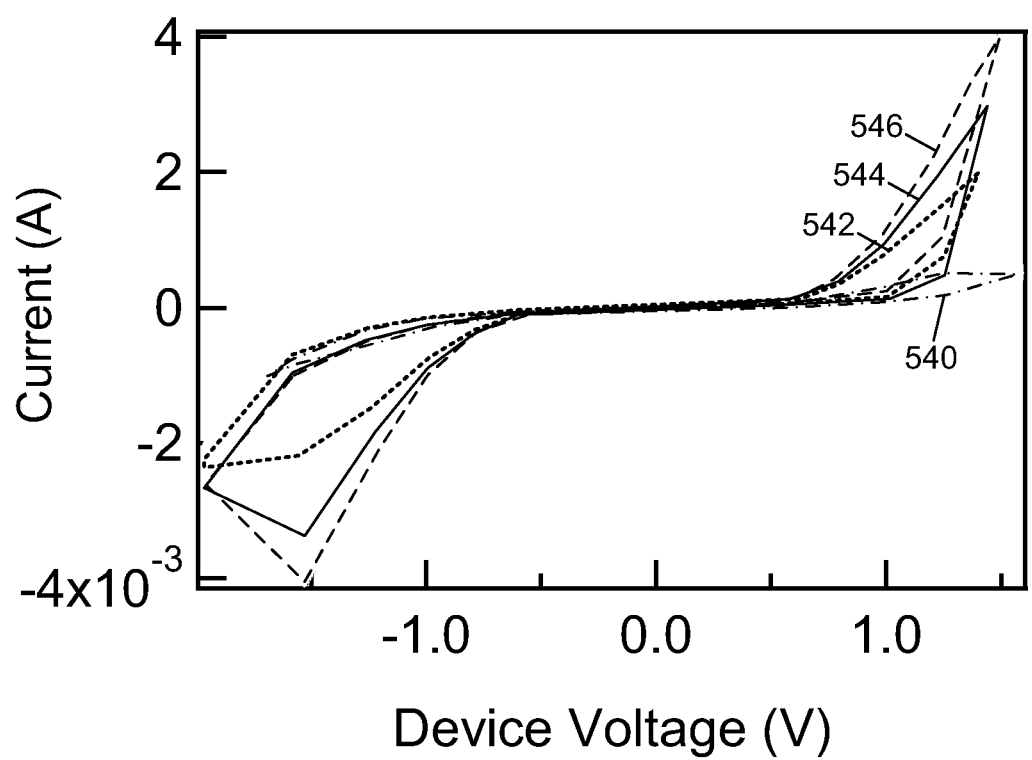
FIG. 5J shows a current voltage graph of the performance of a combined device, according to one example of principles described herein.

In the combined device (528), the analog switching nature of the memristive matrix is retained, as shown in FIG. 5J. The resistance of the memristive matrix can be programmed to a desired level of resistivity using the proper combination of polarity, voltage, and duration. FIG. 5J shows four current/voltage curves for four different programmed resistance states in the memristive matrix in a combined device (528). A first high resistance state results in behavior shown by a first dash-dot curve (540). The second and third intermediate resistance states result in second dashed curve (542) and third solid curve (544). The lowest resistance state results in current/voltage behavior that is shown by a fourth dashed curve (546). The states and curves shown in FIG. 5D are only illustrative. The resistance of the memristive device is variable through an analog range of resistances that result in a wide range of current/voltage behaviors.

Figure 6:
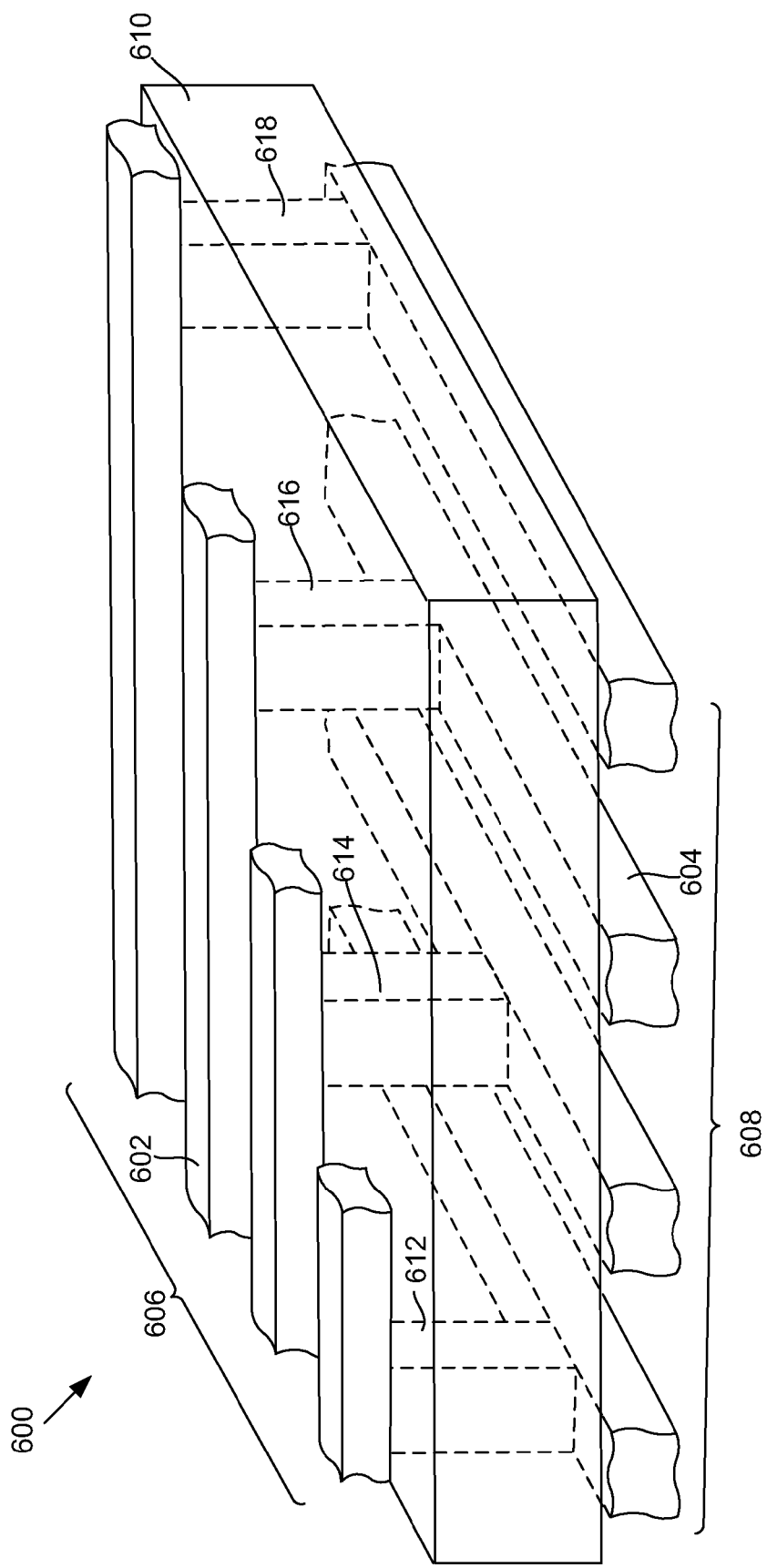
FIG. 6 is an isometric view of a nanowire crossbar architecture incorporating customizable nonlinear electrical devices, according to one example of principles described herein.

The substantially nonconductive nature of the combined device (528) at low voltages can provide a number of advantages when the combined device is used in a memory array. FIG. 6 shows a perspective view of a nanowire memory array (600) revealing an intermediate layer (610) disposed between a first layer of approximately parallel nanowires (608) and a second layer of approximately parallel nanowires (606). According to one illustrative example, the intermediate layer (610) may be a dielectric layer. A number of the combined devices (612-618) are formed in the intermediate layer (610) at the intersections between wires (602) in the top layer (606) and wires (604) in the bottom layer (608). The wires may serve as the upper and lower conductive layers in the combined device. For example, when forming a combined device similar to that the example shown in FIG. 5C, the wires in the top layer (606) could be formed from tantalum and the wires in the bottom layer (608) could be formed from platinum. The upper wires would then serve as the tantalum layer (505, FIG. 5C) and the lower wires would serve as the lower platinum layer (526, FIG. 5C). For purposes of illustration, only a few of the combined devices (612-618) are shown in FIG. 6. Each of the combined devices (612-618) may be used to represent one or more bits of data. For example, in the simplest case, a combined device may have two states: a conductive state and a nonconductive state. The conductive state may represent a binary "1" and the nonconductive state may represent a binary "0", or visa versa. Binary data can be written into the nanowire memory array (600) by changing the conductive state of the memristive matrix within the combined devices. The binary data can then be retrieved by sensing the conductive state of the combined devices (612-618).

The example above is only one illustrative example of the nanowire memory array (600). A variety of other configurations could be used. For example, the memory array (600) can incorporate combined elements that have different structures. The different structures could include more or less layers, layers that have different compositions than described above, and layers that are ordered in different ways than shown in the example given above. For example, the memory array could include memristors, memcapacitors, meminductors, or other memory elements. Further, the memory array could use a wide range of conductors to form the crossbars.

Figure 7A:
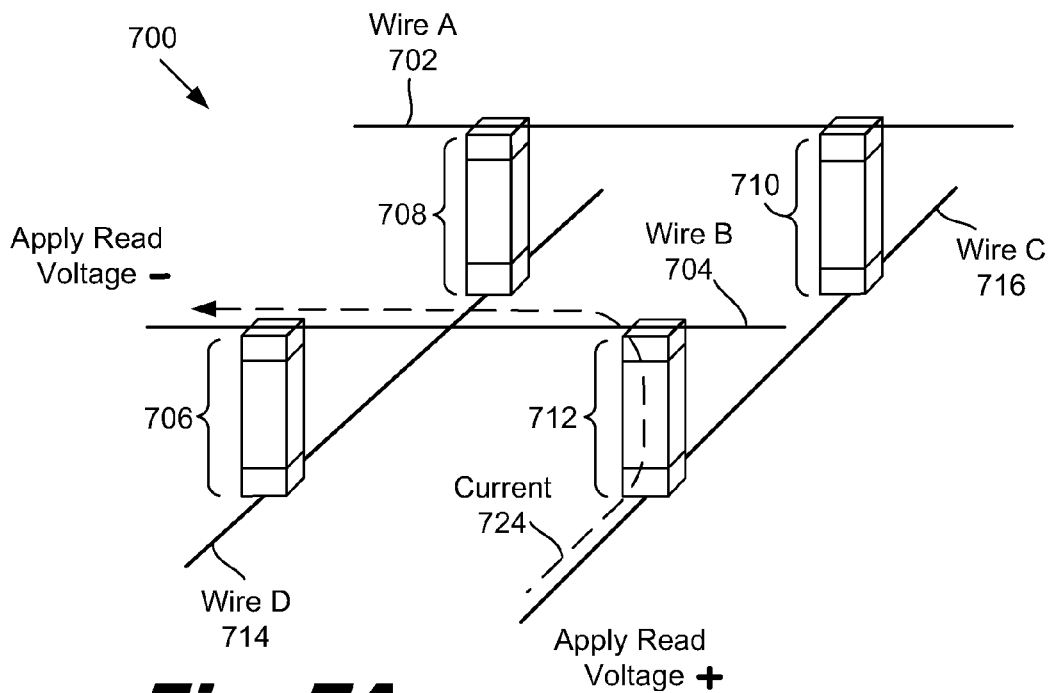
FIGS. 7A and 7B are illustrative diagrams which show current paths through a portion of a crossbar architecture, according to one example of principles described herein.

The current blocking central region (530, FIG. 5H) of the combined device can significantly reduce current leakage within the nanowire memory array (600). FIG. 7A is diagram which shows a nanowire memory array (700). For purposes of illustration, only a portion of the crossbar architecture (700) has been shown and the nanowires (702, 704, 714, 716) have been shown as lines. Nanowires A and B (702, 704) are in an upper layer of nanowires and nanowires C and D (714, 716) are in a lower layer and nanowires. Combined devices (706-712) connect the various nanowires at their intersections.

According to one example, the state of a combined device (712) between wire B (704) and wire C (716) can be read by applying a negative (or ground) read voltage to wire B (704) and a positive voltage to wire C (716). For example, a −0.6 volts may applied to wire B (704) and +0.6 volts can be applied to wire C (712). Thus, a total voltage of 1.2 volts would exist only across this combined device (712). Referring back to the graph shown in FIG. 5H, the application of 1.2 volts will allow the state of the memristive matrix to be determined as shown by points E and F. The remainder of the devices attached to wire B (704) will be exposed to only −0.6 volts and the remainder of devices attached to wire C will be exposed to only +0.6 volts. The devices which are exposed to only one part of the read voltage are called "half selected" devices. Ideally, if a current (724) flows through the device (712) when the read voltages are applied, the reading circuitry can ascertain that the device (712) is in its conductive state. If an insubstantial current or low current flows through the device (712), the reading circuitry can ascertain that the device (712) is in its resistive state.

However, if the junction elements between the nanowires are purely resistive in nature (i.e. a low resistance is a conductive state and a high resistance is a resistive state) a number of leakage currents can also travel through other paths ("sneak paths"). These leakage currents can be thought of as "parasitic current" which obscures the desired reading of the junction (712). Further, junction elements that include a series linear resistor are much more difficult to read because a significant portion of the voltage drop will be across the linear resistor. This can obscure the programmable resistance of the memristor and make programming the memristor more difficult.

Figure 7B:
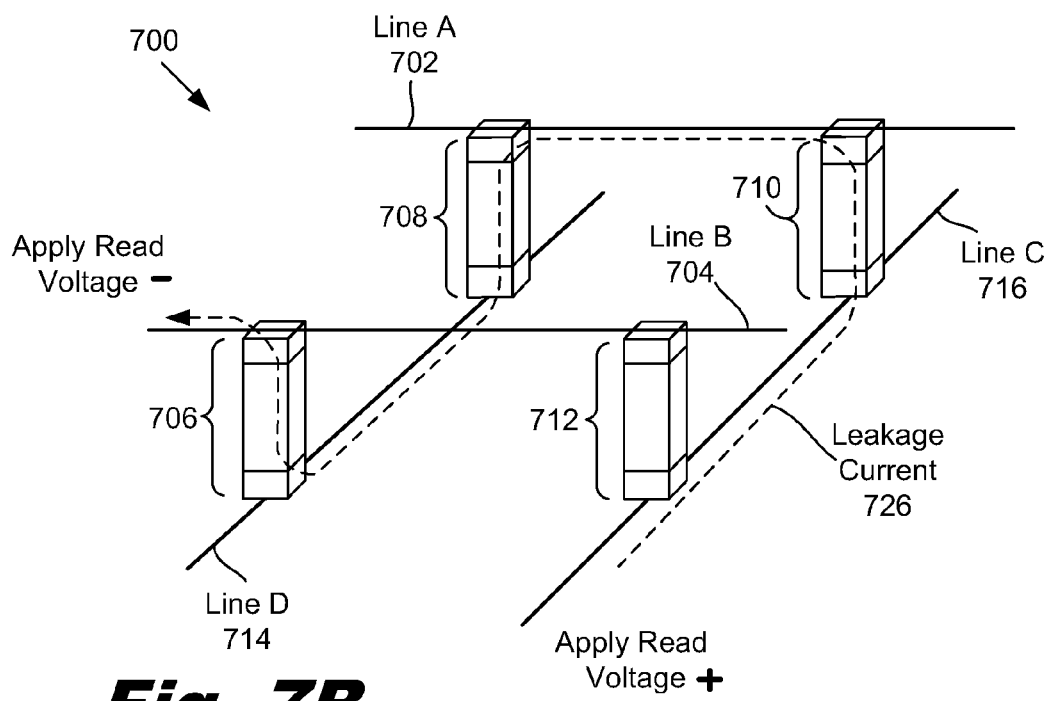

FIG. 7B shows a leakage current (726) which travels through an alternative path between wire C (716) and wire B (704). The example in FIG. 7B assumes that the junctions have a linear resistance. The leakage current (726) travels through three junctions (710, 708, 706) and is present on line B (704). As can be imagined, in an array of greater size than that illustrated in FIG. 7B, various leakage currents could travel through a large number of alternative paths and be present on line B (704) when it is sensed by the reading circuitry. These leakage currents can produce a significant amount of undesirable current which obscures the desired reading of the state of the junction (712).

However, if the junctions shown in FIG. 7B were combined devices, the leakage current would be blocked because half selected devices and non-selected devices conduct negligible current at low voltages. For example, if the devices are combined devices have the electrical characteristics described in FIG. 5C, the leakage current (726) would be blocked. The two half selected devices (710, connected to line C; 706 connected to line B) would conduct minimal current when exposed to ±0.6 volts. The unselected device (708) which is not connected to either line B or line C would not conduct any current due to the rectifying behavior of the combined device. Thus, this leakage current (726) and other leakage currents following other paths would be blocked. This reduces signal noise in the memory array and allows the conductive state of a targeted device to be more accurately read. Further, the use of nonlinear devices in a memory array can lead to reduced power consumption and heating. Low power consumption may be a particular advantage when the memory array is used in a battery operated computing device. If the device has asymmetrical rectifying behavior, the interface with stronger rectifying characteristics can be placed to preferentially block the leakage currents.

Figure 8:
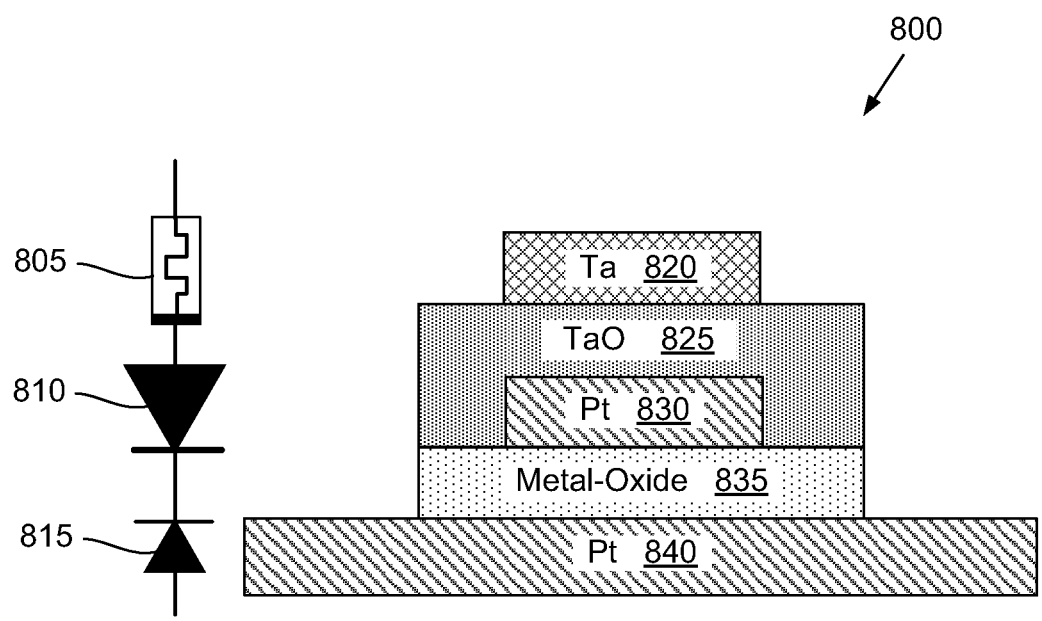
FIG. 8 shows an electrical schematic and a cross-sectional diagram of a combined device that includes a memristor and customizable nonlinear device, according to one example of principles described herein.

The implementations described above are only examples. A variety of other configurations, structures, and materials could be used. For example, FIG. 8 shows an alternative configuration of a combined device (800). In this example, a tantalum layer (820) interfaces with a tantalum oxide memristive layer (825). The tantalum oxide memristive layer (825) surrounds an upper platinum layer (830) on three sides. This configuration has the benefit of preventing shorting between the three electrodes (820, 830, 840). A tantalum metal-oxide layer (835) forms a strongly rectifying interface with the upper platinum layer (830) and a weaker rectifying interface with the lower platinum layer (840). This non-symmetric rectifying behavior can be achieved in the method illustrated in FIG. 4A. The bottom platinum layer (840) may be disposed on a substrate that is not shown.

The combined device (800) could have a variety of alternative configurations. For example, rather than having the memristive layer (825) wrap around an adjoining electrode, all the layers may have the same footprint and form a simple stack. This stack can be formed and used so that undesirable shorting between the electrodes does not occur. Further, a variety oxides and metals could be used to form the various layers.

To the left of the cross sectional view of the combined device (800), an electrical schematic is shown. The tantalum layer (820), tantalum oxide memristive layer (825) and middle platinum layer (830) form the memristor (805). The interface between the upper platinum layer (830) and the tantalum metal-oxide layer (835) forms the strongly rectifying interface that is represented by the large diode symbol (810). The interface between the tantalum metal-oxide layer (835) and the bottom platinum layer (840) forms a weaker rectifying interface that is shown by the smaller diode symbol (815).

Thus, the customizable nonlinear electrical device (800) includes a first conductive layer (840) and a second conductive layer (830) with a metal-oxide layer (835) sandwiched between the first conductive layer and the second conductive layer. The metal-oxide layer is a mixture of co-existing metal atoms and metal oxides. This forms a first rectifying interface between the metal-oxide layer and the first conductive layer and a second rectifying interface between the metal-oxide layer and the second conductive layer.

The electrical characteristics of the metal-oxide layer can be customized to match the electrical characteristics of the memristor in a variety of ways. For example, the break down of the rectifying interfaces can be tuned to match a reading voltage of the memristor. To do this, the mixture of metal atoms and metal oxides can be selected such that at least one of the rectifying interfaces blocks currents below a reading voltage and at least one of the rectifying interfaces breaks down to allow electrical current to flow through the memristor at the reading voltage. Additionally or alternatively, the rectifying interfaces and metal-oxide layer may be customized to exhibit a desired electrical resistance when a reading voltage or programming voltage is applied across the device. In general, the resistance of the rectifying interfaces and the metal-oxide layer should be large (blocking) when below a read voltage and significantly smaller at or above the reading voltage. The current carrying capability of the rectifying interfaces and metal-oxide layer can also be matched to the current capabilities of the memristor or other memory device. For example, if the memristor is capable of sustaining 100 milliamps, the current carrying capacity and rectifying behavior of the interfaces and metal-oxide layer can be designed to operate current levels that are at or above 100 milliamps.

Asymmetric devices may be useful when current is intended to flow through the combined device in only one direction for certain regimes. For example, in FIG. 7B, it may be desirable for the current to only flow through the combined devices from the bottom electrodes to the top electrodes during reading operations. The combined devices can be customized to have a strong rectifying interface that blocks currents flowing the opposite direction until a much higher programming voltage is applied.

In this example and other examples, the layers can be deposited and formed using a number of techniques, including plating, sputtering, vapor deposition, lithography, laser ablation, and other techniques. Additionally, a variety of different types of metals and metal oxides could be used. For example, high work function metals such as platinum and cobalt could be used in combination with n-type metal oxides while metals with lower work functions such as tungsten, gold, aluminum, titanium, and titanium nickel could be combined with p-type metal oxides.

Figure 9:
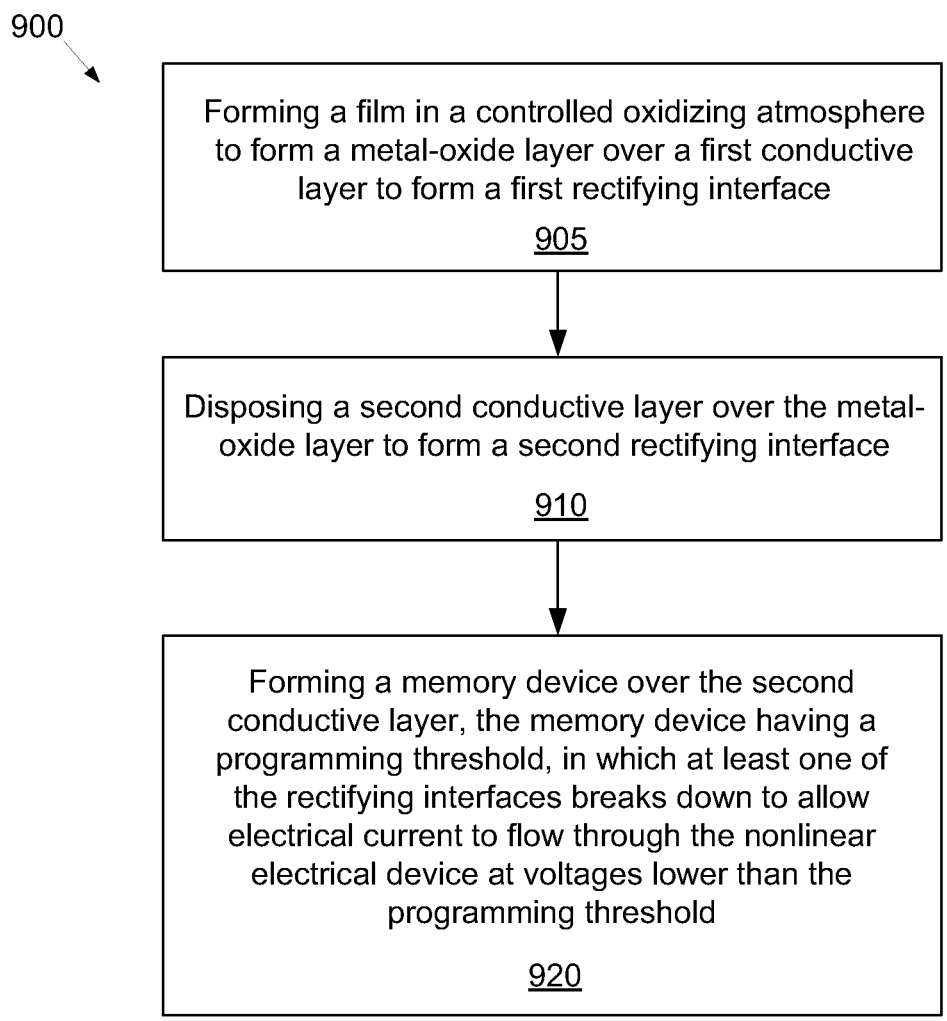
FIG. 9 is a flowchart describing a method for manufacturing a customized nonlinear electrical device, according to one example of principles described herein.

FIG. 9 is a flowchart describing a method for manufacturing a customized nonlinear electrical device. A film is formed in a controlled oxidizing atmosphere to form a metal-oxide layer over a first conductive layer to form a first rectifying interface (block 905). For example, the metal-oxide layer may be formed directly on the conductive layer or may be partially or completely separated from the conductive layer. In FIG. 5G, the metal-oxide layer (510) is separated from the conductive layer (526) by a number of intervening layers. In FIG. 8, the metal-oxide layer (835) is formed directly on the conductive layer (522). Disposing a second conductive layer over the metal-oxide layer forms a second rectifying interface (block 910).

The metal-oxide layer may have a variety of compositions and be formed in a variety of ways. In one implementation, the thin film deposition chamber is a sputtering chamber and the metal-oxide layer is a sputtered thin film. The composition of the sputtered metal-oxide layer is selected so that at least one characteristic of the resulting nonlinear electrical device is customized for operation with a memory device and/or memory array. The memristive element or family of memristive elements can be characterized prior to the formation of metal-oxide layer so that the metal-oxide layer can be appropriately customized. For example, a flow rate of oxygen in a sputtering gas can be selected so that the sputtered metal-oxide layer is deposited with the desired ratio of metal oxide and unoxidized metal such that at least one of the rectifying interfaces breaks down to allow electrical current to flow through the nonlinear electrical device at voltages lower than the programming voltage threshold of the memory device.

In some examples, the oxygen concentration in the sputtering gas can vary during deposition of the metal-oxide layer. As described above, this can be used to produce an asymmetric nonlinear device. Other customizations may include ensuring that the current capacity of the sputtered metal-oxide layer is not less than the memory device and ensuring that the electrical resistance of the nonlinear device when a rectifying interface has broken down is less than electrical resistance of the memory device. In addition to varying the oxygen concentration in the sputtering gas, a variety of other parameters can be selected to customize the nonlinear device. For example, deposition rate of the metal-oxide layer, the substrate temperature, and the thickness of the metal-oxide layer, the type of metal conductive layer and the type of metal used in the metal-oxide can all be selected to produce the desired customization of the nonlinear device.

A second conductive layer is disposed over the metal-oxide layer to form a second rectifying interface (block 915). In one implementation, the conductive layers may be formed from a metal. A memory device is disposed over the second conductive layer (block 920). The memory device has a programming voltage threshold. Voltages that are greater than the programming voltage threshold change the resistance characteristics of the memory device. Voltages that are below the programming voltage threshold do not cause changes in the resistance of the memory device. In some implementations, the programming voltage threshold may not be a single voltage, but a range of voltages. At least one of the rectifying interfaces breaks down to allow electrical current to flow through the nonlinear electrical device at voltages lower than the programming voltage threshold.

In conclusion, nonlinear devices formed according to the principles described above have a number of advantages, including a broad range of rectifying behavior, robust rectifying behavior that can sustain very high current, customizable rectifying behavior for unique circuit needs, and are readily integrable with thin film nano device fabrication. The nonlinear devices can be customized to a specific application can provide switching, amplifying, and current blocking functions that are tailored to improve the function and efficiency of the circuit. Characteristics of the nonlinear devices, such as the breakdown voltage, the conductance, and the blocking region can be customized in a number of ways, including the selection of an appropriate metal and the amount of oxygen in the thin film. The nonlinear devices can be integrated with a number of other devices, including memory devices such as memristors. When nonlinear devices are included in nanowire memristive memory arrays, leakage currents can be blocked or significantly reduced. This reduces leakage currents in the memory array and allows the conductive state of a targeted memory element to be more accurately read. The nonlinear devices also protect the memristor in non-switching mode. Further, the use of nonlinear devices in a memory array can lead to reduced power consumption and heating.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A customizable nonlinear electrical device comprising:
a first conductive layer;
a second conductive layer; and
a sputtered metal-oxide layer wherein sputtering of said metal-oxide layer is with controlled oxygen levels such that said metal-oxide layer comprises an electrically conductive mixture of co-existing metal atoms and metal oxides, said metal oxide layer being sandwiched between the first conductive layer and the second conductive layer to form a first rectifying interface between the metal-oxide layer and the first conductive layer and a second rectifying interface between the metal-oxide layer and the second conductive layer.

2. The device of claim 1, in which the metal-oxide layer comprises a first concentration of oxide at the first rectifying interface and second concentration of oxide at the second rectifying interface, in which the first concentration of oxide is higher than the second concentration of oxide, in which the first rectifying interface exhibits stronger rectifying behavior and a higher breakdown voltage than the second rectifying interface.

3. The device of claim 1, in which the metal-oxide layer comprises one of: a crystalline film, an amorphous film, or a film with one crystalline phase and one amorphous phase.

4. The device of claim 1, in which the metal-oxide layer comprises a sputtered film comprising a transition metal oxide matrix and unoxidized transition metal interspersed in the transition metal oxide matrix.

5. The device of claim 1, in which the first conductive layer and the second conductive layer comprise different metals.

6. The device of claim 1, in which the metal atoms comprise a first metallic element and the metal oxides comprise a second metallic element.

7. The device of claim 1, further comprising a memory device, in which the memory device is one of: a memristor, a memcapacitor, or a meminductor.

8. The device of claim 7, in which the memory device comprises a tantalum layer, a tantalum oxide memristive matrix, and a platinum layer, in which the tantalum oxide memristive matrix is sandwiched between the tantalum layer and the platinum layer.

9. The device of claim 7, in which the memory device comprises a memristive matrix and mobile dopants to move through the memristive matrix in response to an applied programming voltage, the programming voltage being greater than a programming voltage threshold.

10. The device of claim 9, in which electrical characteristics of the first rectifying interface are matched to the electrical characteristics of the memory device such that the first rectifying interface is to break down to allow electrical current to flow through the nonlinear electrical device at reading voltages lower than the programming voltage threshold.

11. The device of claim 7, in which an electrical resistance of the metal-oxide layer and interfaces with the metal-oxide layer at a first reading voltage is matched to an electrical resistance through the memory device at the first reading voltage such that memory device state can be determined.

12. The device of claim 1, in which the customizable nonlinear electrical device exhibits a current blocking region at voltages below a reading voltage and programmable analog switching behavior through a range of electrical resistances when a programming voltage is applied that is greater than the reading voltage.

13. A method for forming a nonlinear electrical device comprising:
    sputtering a metal-oxide layer in a controlled oxidizing atmosphere over a first conductive layer to form a first rectifying interface in which the metal-oxide layer comprises an electrically conductive mixture of co-existing metal atoms and metal oxides;
    disposing a second conductive layer over the metal-oxide layer to form a second rectifying interface; and
    forming a memory device over the second conductive layer, the memory device having a programming voltage threshold;
    in which at least one of the rectifying interfaces is to break down to allow electrical current to flow through the nonlinear electrical device at voltages lower than the programming voltage threshold.

14. The method of claim 13, further comprising controlling oxygen flow in the controlled oxidizing atmosphere to produce the metal-oxide layer with an electrically conductive mixture of co-existing metal atoms and metal oxides such that at least one of the rectifying interfaces is to break down to allow electrical current to flow through the metal-oxide layer at voltages lower than the programming voltage threshold.

15. A customizable nonlinear electrical device comprising:
    a first conductive layer;
    a second conductive layer;
    a sputtered metal-oxide layer, wherein sputtering of said metal-oxide layer is with controlled oxygen levels such that said metal-oxide layer comprises an electrically conductive mixture of co-existing metal atoms and metal oxides, said metal oxide layer being sandwiched between the first conductive layer and the second conductive layer to form a first rectifying interface between the metal-oxide layer and the first conductive layer and a second rectifying interface between the metal-oxide layer and the second conductive layer, the metal-oxide layer comprising an electrically conductive mixture of co-existing metal atoms and metal oxides; and
    a memristor, in which electrical characteristics of the metal-oxide layer are customized to match a reading voltage of the memristor such that at least one of the rectifying interfaces is to block currents below a reading voltage and at least one of the rectifying interfaces is to break down to allow electrical current to flow through the memristor at the reading voltage.

* * * * *